(12) United States Patent
Reed

(10) Patent No.: US 8,226,839 B1
(45) Date of Patent: Jul. 24, 2012

(54) METHOD OF PATTERNING AN AEROGEL

(75) Inventor: Scott T. Reed, Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 527 days.

(21) Appl. No.: 12/480,158

(22) Filed: Jun. 8, 2009

(51) Int. Cl.
*C03C 15/00* (2006.01)

(52) U.S. Cl. .......................................... 216/41; 430/322

(58) Field of Classification Search .................. None
See application file for complete search history.

(56) References Cited

U.S. PATENT DOCUMENTS

| | | | | |
|---|---|---|---|---|
| 3,542,612 | A | * 11/1970 | Cashau et al. ..................... | 430/5 |
| 5,565,142 | A | 10/1996 | Deshpande et al. | |
| 5,641,541 | A | * 6/1997 | Chen ........................... | 427/255.6 |
| 5,948,482 | A | 9/1999 | Brinker et al. | |
| 6,987,071 | B1 | 1/2006 | Bollman et al. | |
| 7,485,343 | B1 | 2/2009 | Branson et al. | |

OTHER PUBLICATIONS

Geng, Semiconductor Manufacturing Handbook, 2005, McGraw-Hill, section 11.5.*

Sangeeta et al, Inorganic materials chemistry desk reference,2005, CRC Press, p. 8-10.*

Okunev et al, Kinetics of the SiO2 aerogel dissolution in aqueous NaOH solutions: experminent and model, 1999, Journal of Non-crystalline solids, p. 21-30.*

Fan, SK, et al., "MEMS with Thin-Film Aerogel", Proceedings: IEEE Micro Electro Mechanical Systems Workshop, (2001), pp. 122-125.

* cited by examiner

*Primary Examiner* — Binh X Tran
*Assistant Examiner* — David Cathey, Jr.
(74) *Attorney, Agent, or Firm* — Lowell Carson

(57) ABSTRACT

A method for producing a pattern in an aerogel disposed as a coating on a substrate comprises exposing the aerogel coating to the vapors of a hydrophobic silane compound, masking the aerogel coating with a shadow photomask and irradiating the aerogel coating with ultraviolet (UV) irradiation. The exposure to UV through the shadow mask creates a pattern of hydrophobic and hydrophilic regions in the aerogel coating. Etching away the hydrophilic regions of the aerogel coating, preferably with a 1 molar solution of sodium hydroxide, leaves the unwetted and unetched hydrophobic regions of the aerogel layer on the substrate, replicating the pattern of the photomask. The hydrophobic aerogel pattern can be further exposed to UV irradiation if desired, to create a hydrophilic aerogel pattern.

19 Claims, 1 Drawing Sheet

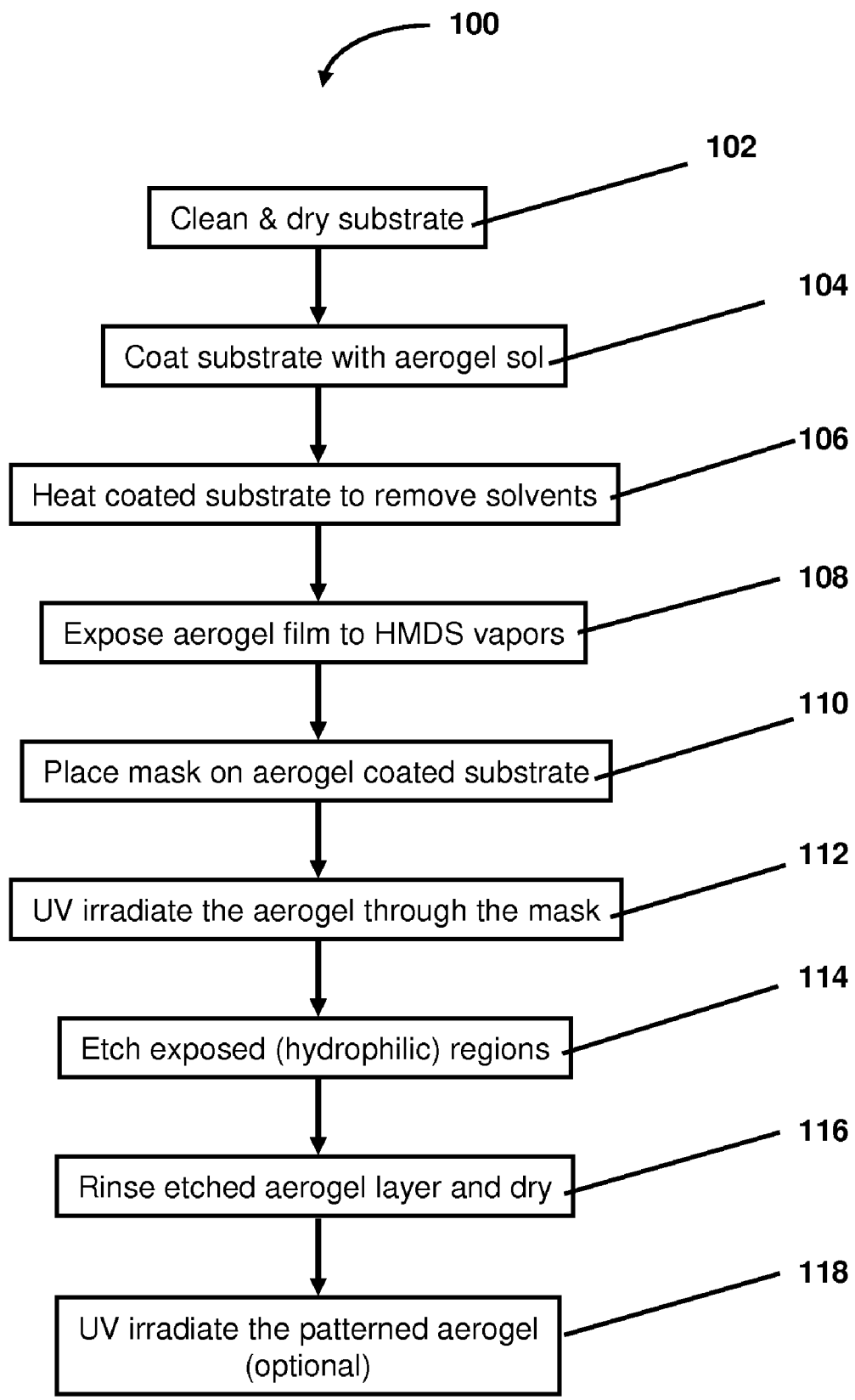

METHOD OF PATTERNING AN AEROGEL

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to the patterning of aerogels that are very porous materials, with low refractive index, and are produced by sol-gel processing. The invention further relates to methods for etching sharply defined patterns in porous aerogel films disposed on a substrate. The methods overcome the limitations of irregularly edged features typically produced when traditional photolithographic methods are applied to porous materials.

BACKGROUND OF THE INVENTION

Aerogels are very porous nanostructured materials typically prepared by sol-gel processing. Typical aerogels can exhibit up to 99% porosity, low refractive index ($\eta<1.1$) high surface area (>1000 $m^2/g$), and small pores (<10 nm). Aerogels generally comprise dielectric materials such as the oxides of silicon, aluminum and titanium, and can also include organic polymers. Aerogels have many applications including catalyst supports, electrical insulators, thermal insulators, and acoustic insulators. It is desired in many applications to employ an aerogel material as a film (e.g. a layer on the order of 1 um thick) on a substrate (e.g. glass, silicon, metal, ceramic, etc.) in applications ranging from the fabrication of micro-electromechanical (MEM) devices to optical display and solar energy conversion devices. In many of these applications it is required that the aerogel film be patterned on the surface of the substrate, creating sharply defined, exposed areas (e.g. aerogel removed) on the substrate and adjacent unexposed areas (e.g. areas remaining covered by the aerogel layer) on the substrate. Due to the porous nature of the aerogel layer, traditional photolithographic techniques typically produce poorly defined pattern edges between the exposed and unexposed areas of the substrate. What are needed are methods that overcome this limitation and allow the creation of sharply defined patterned features of aerogel layers on the surface of the substrate.

BRIEF DESCRIPTION OF THE DRAWINGS

The accompanying drawings, which are incorporated in and form part of the specification, illustrate embodiments of the present invention and, together with the description, serve to explain the principles of the invention.

FIG. 1 is a schematic flow chart of an embodiment of a method according to the present invention.

DETAILED DESCRIPTION OF THE INVENTION

Bulk aerogels are typically made by the super critical solvent extraction of a fluid containing gel (e.g. precursor sol, or simply sol) in a high pressure autoclave in excess of 1100 psi. Processing gels under supercritical conditions avoids the collapse of the porous gel structure due to drying shrinkage, driven by the forces of capillarity that occur in ambient pressure solvent evaporation. Commonly owned U.S. Pat. No. 5,565,142 herein incorporated by reference in its entirety, discloses methods for making bulk aerogels at ambient temperature and pressure that avoid super critical processing and allow drying at ambient pressures and temperatures. These methods produce an organic modification of the gel pore surfaces that enhance hydrophobicity, greatly reducing the forces of capillarity and thereby preventing gel collapse during drying.

An extension of this work is described in commonly owned U.S. Pat. No. 5,948,482 herein incorporated by reference in its entirety, which describes methods to deposit aerogel thin films by either spin, dip or spray coating onto the surface of a substrate, again avoiding the need for super critical drying. These aerogel thin films are also highly porous and have applications in chromatography, fluidics, sensors, optics, electronics, and additionally as selective absorbents, inorganic hosts for bioactive species, catalysts, and membranes. The films produced by the methods disclosed are of uniform thickness and can be on the order of one micron (1 um) thick per coating operation.

Commonly owned U.S. Pat. No. 7,485,343 herein incorporated by reference in its entirety, discloses methods for preparing hydrophobic coatings on the surface of a substrate by exposing an aerogel film deposited on the substrate to vapors of hydrophobic silane compounds, such as hexamethyl disilazane (HMDS). Exposure of an aerogel to HMDS vapor results in a further organic modification of the pore surfaces of the aerogel, forming what have come to be called "super hydrophobic" coatings which can exhibit water contact angles of greater than 150°. Further described are methods for creating patterns of hydrophilic areas on the coated surface of the substrate by exposing the hydrophobic coating to ultraviolet (UV) irradiation. Exposure to UV radiation generates ozone in the pores of the hydrophobic aerogel which oxidizes the organic modification of the pore surfaces, returning the aerogel surface to a more hydrophilic state (i.e. having a reduced water contact angle).

The methods according to the present invention take advantage of the ability to create hydrophobic and hydrophilic areas on the surface of an aerogel coated substrate to provide for patterning the aerogel film by use of aqueous reagents. Wherein desired areas of the aerogel film are removed by etching (e.g. subtractive processing) exposing the underlying substrate and leaving behind a patterned aerogel film disposed on the surface of the substrate. The methods according to the present invention have been found to produce features (e.g. lines) with sharper edges than can be realized using traditional photolithographic methods.

Aerogel films as-deposited onto a substrate are somewhat hydrophobic. This hydrophobicity can be eliminated by exposing the as-deposited aerogel film to an ultraviolet (UV) light source (e.g. $\lambda\sim185$ nm). The UV light reacts with the ambient atmosphere to generate ozone in the pores of the aerogel which oxidizes the organic modification on the internal pore surfaces. The resulting hydrophilic aerogel film pores (i.e. those exposed to UV/ozone treatment) can now be wetted by water and/or aqueous etchants while the hydrophobic aerogel pores (i.e. those not exposed to UV/ozone) are not wetted.

To pattern the as-deposited aerogel into hydrophobic and hydrophilic regions a patterned metal mask on silica (e.g. an etched chrome photomask) as typically used in microelectronic manufacturing, can be placed proximal to (e.g. near or in direct contact with) the aerogel film, preferably with the metal side of the mask in contact with the aerogel film. The "masked" aerogel film can then be exposed to UV illumination. The metal areas of the mask prevent UV light from impinging on the aerogel film and no ozone is created in the pores, while the clear areas of the mask allow UV light to impinge on the film and create ozone in the illuminated pores. The illuminated areas of the aerogel film therefore form a pattern of hydrophilic material (i.e. aerogel) that can be etched by aqueous reagents. If the UV exposure through the clear areas of the mask is not long enough the organic modification remains on the surface of the aerogel and the aerogel remains hydrophobic. If the exposure through the mask is too long ozone can diffuse laterally into the masked regions of the aerogel film enlarging the hydrophilic aerogel region causing the etched aerogel areas to be too large.

Water can cause the collapse of the hydrophilic aerogel when it is dried leaving a silica residue on the surface of the substrate (e.g. in the case for a silica based aerogel). Various concentrations of hydrofluoric acid etchants were tried unsuccessfully to fill the pores and etch the silica. It was found however that a glass etchant of 1 molar sodium hydroxide was able to remove the hydrophilic regions of the aerogel film and not leave a silica residue, however this etchant also slightly etched the hydrophobic aerogel regions. This can reduce the sharpness of the aerogel pattern, a condition referred to as over etching.

The etching of the as-deposited hydrophobic aerogel by 1 molar sodium hydroxide etchants and resultant over etching can be eliminated by enhancing the hydrophobicity of the as-deposited aerogel film. After aerogel film coating of the substrate and before exposure to UV the coated substrate is placed in hexamethyl disilazane (HMDS) vapors (i.e. an organofunctional silane). This insures a more complete organic modification of the aerogel surface. This was found to greatly reduce the over etching problem.

FIG. 1 is a schematic flow chart of an embodiment of a method according to the present invention. Method 100 begins at step 102 where a substrate, such as a glass blank or silicon wafer is cleaned and dried. A typical cleaning process for a glass substrate can include, scrubbing the substrate using a solution of water and an alkaline cleaning agent, rinsing the substrate with tap water then thoroughly rinsing the substrate with deionized (DI) water, followed by blowing the substrate dry with filtered nitrogen. A plasma cleaning operation (e.g. 20 minutes in oxygen plasma) can be employed to further remove trace organic contaminants from the surface of the substrate.

At step 104 the substrate is coated with an aerogel sol by spin, dip or spray coating the aerogel sol onto the substrate. In an exemplary embodiment, silicate sols were prepared by the methods described in the '482 patent (incorporated above). Silicate sols were produced from tetraethoxysilane (TEOS) dissolved in ethanol using a two step acid/base catalyzed procedure. Sols comprising aluminum or titanium oxides could be used as well. The prepared sols were aged at 50° C. in an oven having an ambient atmosphere to form the gel structure. The aged gels were then subjected to a pore fluid washing procedure, wherein the original pore fluid (water and ethanol) was ultimately replaced with hexane and a silylating reagent, in this exemplary embodiment hexamethyl disilazane (HMDS). This procedure results in surface derivatization of the pores in the gel by reaction of reactive terminal sites with HMDS (i.e. organic modification of the pore surfaces). The surface-derivatization was followed by reliquification of the gel using ultrasound (e.g. sonification). Glass and silicon wafer substrates were then dip coated into the reliquified gel.

At step 106 the coated substrate is heated to drive off the solvents. Heating can be accomplished on a hot plate and typically takes less than one minute. In this example, the hot plate was heated to 180° C.

At step 108 the coated substrate is exposed to hexamethyl disilazane (HMDS) vapors for approximately ten minutes. HMDS vapors were generated by flowing nitrogen gas through a bubbler thereby saturating the gas with HMDS which is directed to flow over the surface of the substrate while on a hot plate. In this example, the hot plate was heated to 180° C. This step insures the surface of the aerogel coated substrate is hydrophobic, which enhances the sharpness of the eventual patterns formed. This step can be considered as a second derivatization process to attach silane groups to reactive sites on the pore surfaces that may have been generated during sonification.

At step 110 a photomask having the eventual desired aerogel pattern is placed in contact with the coated substrate. A patterned metal mask on silica (e.g. etched chrome photomask) as typically used in microelectronic manufacturing can be placed on top of the aerogel film, preferably with the metal side of the mask in contact with the aerogel film.

At step 112 the masked substrate is exposed to UV irradiation. The "masked" aerogel film is exposed to UV illumination of approximately 185 nm wavelength. The metal areas of the mask prevent UV light from impinging on the aerogel film and no ozone is created in the pores, while the clear areas of the mask allow UV light to impinge on the film and create ozone in the illuminated pores. The illuminated areas of the aerogel film form a pattern of hydrophilic material by removal of the organic modification on the internal pore surfaces which can be subsequently etched by aqueous reagents. If the UV exposure through the clear areas of the mask is not long enough the organic modification remains on the surface of the aerogel and the aerogel remains hydrophobic. The time of exposure can be adjusted to accommodate a film thickness and line width of interest, which in the present example was found to be approximately 5 minutes for a 1 um thick film having a line width of 0.25 mm and edge to edge spacing of 0.75 mm.

At step 114 the mask is removed from the substrate and the hydrophilic regions of the aerogel film are etched using a 1 molar sodium hydroxide (NaOH) solution. It was found that a glass etchant of 1 molar NaOH was able to remove the hydrophilic regions of the aerogel film and not leave a silica residue. Etching was performed at room temperature and in the present example, could be accomplished by dipping the coated substrate in the 1 molar NaOH solution, allowing the excess etchant to drain off, and etching for approximately a minute and a half.

At step 116 the substrate now having an etched and patterned aerogel film layer is rinsed and dried. In the exemplary embodiment, the patterned films were rinsed in de-ionized water and let to dry. It should be noted that the patterned hydrophobic areas remaining on the surface of the substrate are not prone to wetting by the de-ionized water and therefore will not collapse upon drying.

Optional step 118 can be employed in applications where it is desired to have a pattern of hydrophilic aerogel remaining on the surface of the substrate. As noted above, at step 116 a hydrophobic aerogel pattern is produced. Irradiating the hydrophobic aerogel pattern with UV will create ozone to remove the organic modification within the pore surfaces of the patterned aerogel. Step 118 can be performed with or without the use of a mask, as an application warrants.

The above described exemplary embodiments present several variants of the invention but do not limit the scope of the invention. Those skilled in the art will appreciate that the present invention can be implemented in other equivalent ways. The actual scope of the invention is intended to be defined in the following claims.

What is claimed is:

1. A method for producing a pattern in an aerogel without use of photoresist, the method comprising:
   providing the aerogel as a coating disposed onto a substrate;
   exposing the aerogel coating to vapors of a silylating agent;
   placing a photomask comprising the pattern proximal to the aerogel coating;
   irradiating the photomask and the aerogel coating with ultraviolet (UV) illumination, such that the aerogel is irradiated with the pattern through the photomask; and,
   etching the irradiated aerogel coating with an etchant, thereby creating the pattern in the aerogel.

2. The method of claim 1 wherein the step of providing comprises one or more of dipping, spraying and spin coating a sol onto the substrate.

3. The method of claim 2 wherein the step of providing comprises the step of transforming a gel to the sol by sonification.

4. The method of claim 1 wherein the substrate comprises one or more of a glass substrate and a silicon substrate.

5. The method of claim 1 wherein the step of exposing comprises exposing the aerogel coating to vapors of hexamethyl disilazane (HMDS).

6. The method of claim 1 wherein the photomask comprises a glass blank having a chromium pattern disposed thereon.

7. The method of claim 6 wherein the step of placing comprises placing the photomask on top of the aerogel coating with the chromium pattern contacting the aerogel coating.

8. The method of claim 1 wherein the step of irradiating comprises irradiating the photomask and the aerogel coating with ultraviolet radiation of substantially 185 nm wavelength.

9. The method of claim 1 wherein the step of etching comprises etching the aerogel coating with an etchant comprising approximately 1 molar sodium hydroxide in an aqueous solution.

10. The method of claim 1 further comprising the steps of rinsing the aerogel coating on the substrate with deionized water and drying the aerogel coating on the substrate.

11. The method of claim 10 wherein said drying is performed at ambient pressure.

12. The method of claim 1 further comprising the step of irradiating the aerogel pattern formed by said etching with ultraviolet (UV) illumination.

13. A method for producing a pattern in an aerogel without use of photoresist, the method comprising:
   providing a substrate;
   coating a surface of the substrate with an aerogel sol;
   heating the coated substrate to remove solvents from the sol;
   exposing the aerogel coating to vapors of a silylating agent;
   placing a photomask comprising the pattern proximal to the aerogel coating;
   irradiating the photomask and the aerogel coating with ultraviolet (UV) illumination, such that the aerogel is irradiated with the pattern through the photomask; and,
   etching the irradiated aerogel coating with an etchant, thereby creating the pattern in the aerogel.

14. The method of claim 13 wherein the substrate comprises a glass or silicon substrate.

15. The method of claim 13 wherein said step of coating comprises one or more of dipping, spraying and spin coating the aerogel sol onto the substrate.

16. The method of claim 13 wherein said silylating agent comprises hexamethyl disilazane (HMDS).

17. The method of claim 13 wherein said irradiating comprises irradiating with ultraviolet (UV) light of approximately 185 nm wavelength.

18. The method of claim 13 wherein said etchant comprises approximately 1 molar sodium hydroxide (NaOH) in an aqueous solution.

19. The method of claim 13 further comprising the step of irradiating the aerogel pattern formed by said etching with ultraviolet (UV) illumination.

\* \* \* \* \*